(12) United States Patent (10) Patent No.: US 9,438,250 B2
Gurumani et al. (45) Date of Patent: Sep. 6, 2016

(54) VARIABLE RATE INTERPOLATION WITH NUMERICALLY CONTROLLED OSCILLATOR

(71) Applicant: Hughes Network Systems, LLC, Germantown, MD (US)

(72) Inventors: Santharam Gurumani, Frederick, MD (US); Bala Subramniam, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 14/483,415

(22) Filed: Sep. 11, 2014

(65) Prior Publication Data

US 2016/0079987 A1 Mar. 17, 2016

(51) Int. Cl.
*H03L 7/099* (2006.01)
*G06F 1/02* (2006.01)
*H03L 7/00* (2006.01)

(52) U.S. Cl.
CPC ............... *H03L 7/00* (2013.01); *G06F 1/022* (2013.01); *H03L 7/0994* (2013.01)

(58) Field of Classification Search
CPC ............ G06F 1/02; G06F 1/022; G06F 1/03; G06F 1/0321; G06F 1/0328; G06F 1/0335; H03K 3/027; H03K 4/026; H03L 1/00; H03L 7/0991; H03L 7/0994
USPC ....... 327/106, 107; 331/1 A, 34, 175, 177 R; 375/371
See application file for complete search history.

(56) References Cited

U.S. PATENT DOCUMENTS

| | | | | |
|---|---|---|---|---|
| 4,494,073 A | * | 1/1985 | Sorgi | 327/105 |
| 7,103,622 B1 | * | 9/2006 | Tucholski | 708/276 |
| 7,907,028 B1 | * | 3/2011 | Mack et al. | 331/175 |
| 8,699,985 B1 | * | 4/2014 | Mar | 455/316 |
| 2003/0063701 A1 | * | 4/2003 | Eubanks | 375/376 |

\* cited by examiner

*Primary Examiner* — Levi Gannon
(74) *Attorney, Agent, or Firm* — Bejin Bieneman PLC

(57) ABSTRACT

A numerically controlled oscillator includes a phase accumulator that outputs a phase word and a clock that periodically outputs a clock signal in accordance with a delay interval. The phase accumulator outputs a new phase word in response to receiving the clock signal. A clock controller calculates a timing drift and adjusts the delay interval to reduce the timing drift. A method includes receiving a plurality of frequency control words, calculating a delay interval, accumulating the frequency control words in accordance with the delay interval to generate a phase word, converting the phase word to a waveform, calculating a timing drift, and adjusting the delay interval to reduce the timing drift.

17 Claims, 2 Drawing Sheets

VARIABLE RATE INTERPOLATION WITH NUMERICALLY CONTROLLED OSCILLATOR

BACKGROUND

Processing communication signals often includes interpolating sampled signals. Interpolation changes the final sample rate before the signal is passed to, e.g., a digital-to-analog converter. Interpolation relies on the clock cycles of the different components used in the communication system. Minor differences in clock cycles, as well as channel delay variations, can lead to inaccuracies, however. Adjusting for such inaccuracies often means storing entire samples at a particular rate and resampling prior to processing. Moreover, detecting the clock inaccuracies often requires feedback from a remote device.

DETAILED DESCRIPTION

One way to accommodate for differences in clock cycles is with a numerically controlled oscillator that provides a fine resolution of timing adjustments when upsampling or downsampling a signal to a desired rate. By continuously making smaller timing adjustments at frequent intervals, the numerically controlled oscillator is able to eliminate the need to store the entire sample at one rate and resample at another, adjusted rate. Further, the numerically controlled oscillator can be configured to correct the timing drift, a priori, without feedback from a remote device. Specifically, timing errors may be introduced every time the numerically controlled oscillator rounds off extra bits. The numerically controlled oscillator can calculate the timing error associated with each rounded-off bit. Thus, without relying on feedback from remote devices, the numerically controlled oscillator can calculate and reduce the timing drift.

Therefore, an exemplary numerically controlled oscillator includes a phase accumulator that outputs a phase word and a clock that periodically outputs a clock signal in accordance with a delay interval. The phase accumulator outputs a new phase word in response to receiving the clock signal. A clock controller calculates a timing drift and adjusts the delay interval to reduce the timing drift. The clock controller may calculate the timing drift by comparing an output sample rate to an input sample rate.

Referring generally to the figures, the elements shown may take many different forms and include multiple and/or alternate components and facilities. The exemplary components illustrated are not intended to be limiting. Indeed, additional or alternative components and/or implementations may be used.

Figure 1:
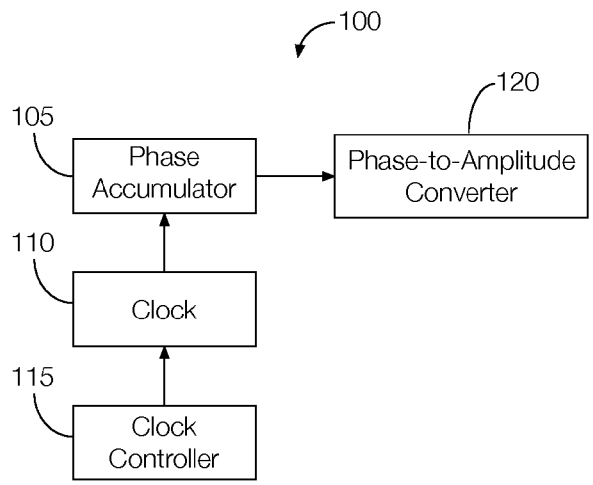
FIG. 1 illustrates an example numerically controlled oscillator implementing variable rate interpolation.

As illustrated in FIG. 1, the numerically controlled oscillator 100 includes a phase accumulator 105, a clock 110, a clock controller 115, and a phase-to-amplitude converter 120.

The phase accumulator 105 may be configured to generate a phase word from a frequency control word. The phase word may include a previous phase word summed with the frequency control word. Thus, the phase word may represent the frequency control word accumulated over time. The phase accumulator 105 may be configured to generate the new phase word at intervals in accordance with the clock signal output by the clock 110. The phase word and the frequency control word may be digital signals representing a particular frequency. Moreover, the frequency control word may be transmitted to the phase accumulator 105 at a particular symbol rate.

The clock 110 may be configured to periodically output a clock signal, at predetermined intervals, to the phase accumulator 105. The intervals may be variable. That is, the interval may be based on a delay signal output by the clock controller 115. The clock 110 may be configured to receive the delay signal and output the clock signal at the prescribed interval accordingly. In some instances, the clock 110 may be configured to output the clock signal every time the delay signal is received.

The clock controller 115 may be configured to control the timing of the output of the clock signal. The clock controller 115 may output a delay signal that may cause the clock 110 to immediately output the clock signal or cause the clock 110 to output the clock signal at an interval represented by the delay signal. Although referred to as a "delay" signal, the output of the clock controller 115 may reduce the interval between clock signals, making the clock signal output more frequently. In other words, the term "delay" indicates that the output of the clock controller 115 sets the delay interval between clock signals and does not necessarily mean that the interval is made longer.

The clock controller 115 may be configured to adjust the delay interval to reduce a timing drift. The timing drift may be caused by, e.g., rounding off extra bits to accommodate the numerically controlled oscillator 100 having a fixed bit width. Each bit that is rounded off may contribute to the timing drift. The clock controller 115 may be configured to calculate the timing drift by, e.g., determining a ratio of the output sample rate to the input sample rate. Moreover, the clock controller 115 may be configured to compare the ratio to a predetermined threshold. When the ratio exceeds the predetermined threshold, meaning the timing drift has exceed a particular value, the clock controller 115 may be configured to determine a new delay interval that will reduce the timing drift. The clock controller 115 may be further configured to generate and output a delay signal representing the new delay interval. The delay signal may be transmitted to the clock 110. The adjustments to the timing drift may be made in small increments and occur between frames or, in some instances, within a single frame. Moreover, because the timing drift is calculated from a ratio of the output sample rate to the input sample rate, the clock controller 115 is able to calculate the timing drift without feedback from a remote device.

The phase-to-amplitude converter 120 may be configured to generate a waveform based on the output of the phase accumulator 105. Therefore, the phase-to-amplitude converter 120 may be configured to receive the phase word and generate an analog signal, such as a sinusoidal signal, in accordance with the received phase word. In one possible approach, the phase-to-amplitude converter 120 may be configured to use a look-up table to generate the waveform. That is, the phase-to-amplitude converter 120 may look up the phase word in the look-up table, find an amplitude sample that corresponds with the phase word, and generate the appropriate output. Alternatively, the phase-to-amplitude converter 120 may be configured to calculate the appropriate waveform from the phase word. Regardless of the approach used, the output of the phase-to-amplitude converter 120 may include an analog representation of the phase word sampled according to the delay interval set by the clock controller 115.

Figure 2:
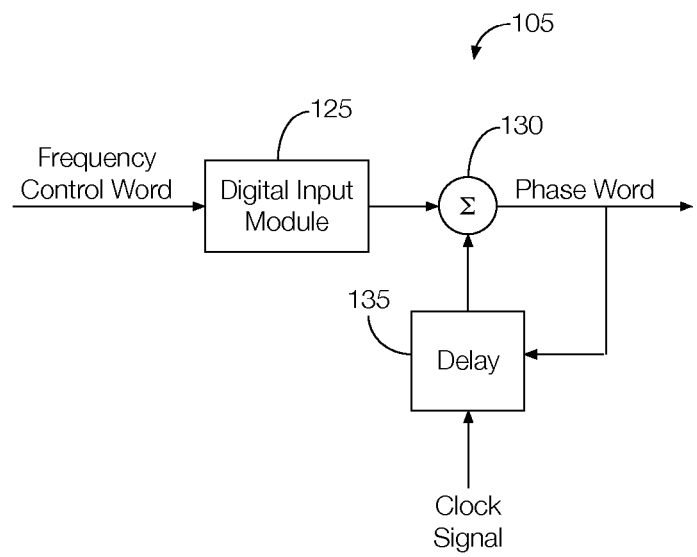
FIG. 2 is a block diagram of an example phase accumulator that may be incorporated into the numerically controlled oscillator FIG. 1.

FIG. 2 is a control diagram of an example phase accumulator 105. As shown, the phase accumulator 105 includes a digital input module 125, a summation block 130, and a delay block 135.

The digital input module 125 may be configured to receive the frequency control word. As discussed above, the frequency control word may include a digital signal transmitted at a particular symbol rate. Moreover, the frequency control word may represent a particular frequency. The digital input module 125 may be configured to pass the frequency control word to the summation block 130.

The summation block 130 may be configured to add multiple inputs. As shown, the inputs to the summation block 130 include the output of the digital input module 125 and the output o the delay block 135. Both inputs to the summation block 130 may be digital signals. That is, one input may include the frequency control word output by the digital input module 125 and the other input may include the phase word, delayed by one clock cycle, output by the delay block 135. The output of the summation block 130 may represent the present phase word, which may include the previous phase word added to the present frequency control word. Therefore, the phase word may represent an accumulation of the frequency control words. The phase word may be output to the phase-to-amplitude converter 120 and to the delay block 135.

The delay block 135 may be configured to receive the output of the summation block 130 and the output of the clock 110. Therefore, the delay block 135 may receive the phase word and the clock signal. In response to receiving the clock signal, the delay block 135 may be configured to output the phase word. The delay block 135 may be configured to act on, e.g., either the rising or falling edge of the clock signal. The output of the delay block 135 may be provided to the summation block 130.

Because the output of the delay block 135 is subject to the timing of the clock cycle, and because the timing of the clock cycle is variable, e.g., set by the clock controller 115, the output timing of the numerically controlled oscillator 100 may be continually adjusted, in small increments, to compensate for channel delays or differences in clock cycles between communication system components.

Figure 3:
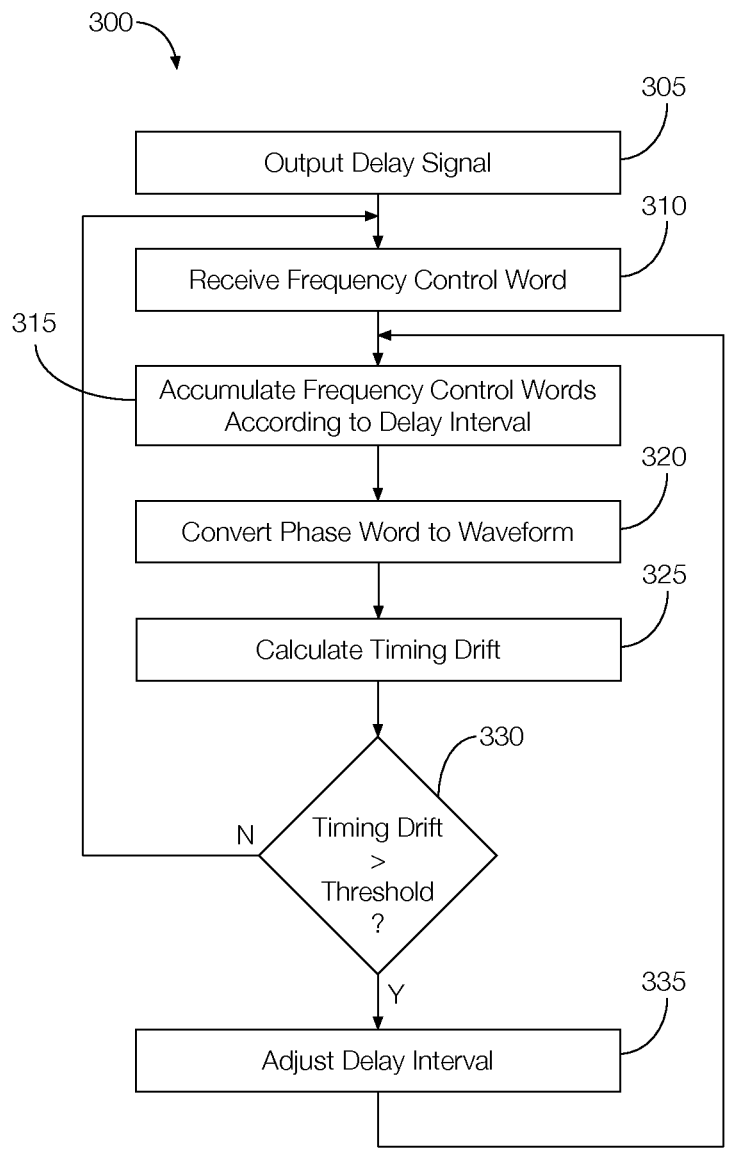
FIG. 3 is a flowchart of an exemplary process that may be used to implement variable rate interpolation.

FIG. 3 is a flowchart of an exemplary process 300 that may be implemented by one or more components of the numerically controlled oscillator 100 discussed above.

At block 305, the clock controller 115 may output a delay signal to the clock 110. The delay signal may represent a calculated delay interval. This initial delay interval may be based on a calibration or other predetermined value. In response to receiving the delay signal, the clock 110 may adjust the delay interval between clock signals in accordance with the delay interval represented by the delay signal.

At block 310, the phase accumulator 105 may receive a frequency control word. The frequency control word, as discussed above, may include a digital signal representing a particular frequency. The frequency control word may be received by the phase accumulator 105 via the digital input module 125.

At block 315, the summation block 130 130 may accumulate the frequency control words by combining the previous phase word with the current frequency control word according to the delay interval set at blocks 305 or 335. The output of the summation block 130 may include the new phase word.

At block 320, the phase-to-amplitude converter 120 may convert the new phase word, output by the summation block 130 at block 315, into a waveform. For instance, the waveform may include a sinusoidal signal representing the accumulation of the frequency control words received by the phase accumulator 105.

At block 325, the clock controller 115 may calculate a timing drift. The timing drift may be caused by, e.g., rounding off extra bits to accommodate the numerically controlled oscillator 100 having a fixed bit width. Each bit that is rounded off may contribute to the timing drift. The clock controller 115 may be configured to calculate the timing drift by, e.g., determining a ratio of the output sample rate to the input sample rate.

At decision block 330, the clock controller 115 may compare the timing drift calculated at block 325 to a predetermined threshold. If the timing drift exceeds the predetermined threshold, the process 300 may continue at block 335. If the timing drift does not exceed the predetermined threshold, the process 300 may return to block 315.

At block 335, the clock controller 115 may adjust the delay interval to reduce the timing drift. That is, the clock controller 115 may reduce or increase the delay interval commanded by the delay signal. After the new delay interval has been calculated, the clock controller 115 may generate a new delay signal and output the new delay signal to the clock 110. The process 300 may continue at block 315 using the new delay signal.

With the process 300, the numerically controlled oscillator 100 can provide a fine resolution of timing adjustments when upsampling or downsampling a signal to a desired rate. By continuously making smaller timing adjustments at frequent intervals, the numerically controlled oscillator 100 can correct the timing drift, a priori, without feedback from a remote device.

In general, the computing systems and/or devices described above may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance. Examples of computing devices include, without limitation, a computer workstation, a server, a desktop, notebook, laptop, or handheld computer, or some other computing system and/or device.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A numerically controlled oscillator comprising:
  a phase accumulator configured to output a phase word;
  a clock configured to periodically output a variable clock signal in accordance with a delay interval, wherein the phase accumulator is configured to output a new phase word in response to receiving the clock signal; and
  a clock controller programmed to calculate a timing drift from a ratio of an output sample rate to an input sample rate and adjust a length of the delay interval of the variable clock signal to reduce the calculated timing drift, wherein the clock controller is programmed to adjust the length of the delay interval of the variable clock signal to a rate calculated from the calculated timing drift.

2. The numerically controlled oscillator of claim 1, wherein the clock controller is configured to set the delay interval.

3. The numerically controlled oscillator of claim 1, wherein the clock controller is configured to output a delay signal representing the delay interval.

4. The numerically controlled oscillator of claim 1, wherein the clock controller is configured to compare the ratio to a predetermined threshold.

5. The numerically controlled oscillator of claim 4, wherein the clock controller is configured to adjust the delay interval to reduce the timing drift if the ratio exceeds the predetermined threshold.

6. The numerically controlled oscillator of claim 1, further comprising a phase-to-amplitude converter configured to generate a waveform in accordance with the phase word output by the phase accumulator.

7. The numerically controlled oscillator of claim 1, wherein the phase word includes an accumulation of frequency control words received by the phase accumulator.

8. The numerically controlled oscillator of claim 1, wherein the phase accumulator includes a digital input module configured to receive a first frequency control word.

9. The numerically controlled oscillator of claim 8, wherein the phase accumulator further includes a summation block configured to receive the first frequency control word from the digital input module and output a first phase word.

10. The numerically controlled oscillator of claim 9, wherein the phase accumulator includes a delay block configured to receive the first phase word from the summation block and output the first phase word to the summation block in response to receiving the clock signal.

11. The numerically controlled oscillator of claim 10, wherein the summation block is configured to add the first phase word to a second frequency control word and output a second phase word.

12. A method comprising:
receiving a plurality of frequency control words in accordance with a variable clock signal;
calculating, via a clock controller, a delay interval of the variable clock signal;
accumulating the frequency control words in accordance with the delay interval to generate a phase word;
converting the phase word to a waveform;
calculating a timing drift from a ratio of an output sample rate to an input sample rate; and
adjusting a length of the delay interval of the variable clock signal to reduce the calculated timing drift, wherein adjusting the length of the delay interval includes adjusting the length of the delay interval to a rate calculated from the calculated timing drift.

13. The method of claim 12, wherein calculating the timing drift includes comparing the ratio to a predetermined threshold.

14. The method of claim 13, wherein the delay interval is adjusted if the ratio exceeds the predetermined threshold.

15. A numerically controlled oscillator comprising:
a phase accumulator having a digital input module configured to receive a plurality of control words, a summation block configured to output a phase word representing an accumulation of the plurality of frequency control words, and a delay block configured to provide the accumulation of the plurality of frequency control words to the summation block;
a clock configured to periodically output a variable clock signal in accordance with a delay interval, wherein the phase accumulator is configured to output the accumulation of frequency control words in response to receiving the clock signal; and
a clock controller programmed to calculate a timing drift from a ratio of an output sample rate to an input sample rate and adjust a length of the delay interval to reduce the calculated timing drift, wherein the clock controller is programmed to adjust the length of the delay interval of the variable clock signal to a rate calculated from the calculated timing drift.

16. The numerically controlled oscillator of claim 15, wherein the clock controller is configured to compare the ratio to a predetermined threshold.

17. The numerically controlled oscillator of claim 16, wherein the clock controller is configured to adjust the delay interval to reduce the timing drift if the ratio exceeds the predetermined threshold.

* * * * *